United States Patent [19]
Lee

[11] Patent Number: 5,847,923
[45] Date of Patent: Dec. 8, 1998

[54] INTERFACE CARD POSITIONING DEVICE

[76] Inventor: Guiy Shing Lee, No. 4, Alley 104, Hualian City, Taiwan

[21] Appl. No.: 874,556

[22] Filed: Jun. 13, 1997

[51] Int. Cl.⁶ .................................. G06F 1/16; A05K 7/12
[52] U.S. Cl. .......................... 361/684; 361/683; 361/796; 361/801; 174/138 G
[58] Field of Search .................................. 361/686, 684, 361/683, 759, 796, 797, 801, 802, 740–742; 174/138 G; 439/59–62, 64; G06F 1/16

[56] References Cited

U.S. PATENT DOCUMENTS

| | | |
|---|---|---|
| 5,544,006 | 8/1996 | Radloff et al. ........................ 361/683 |
| 5,575,546 | 11/1996 | Radloff .................................... 361/726 |
| 5,708,563 | 1/1998 | Cranston, III et al. ................. 361/683 |
| 5,715,146 | 2/1998 | Hoppal ................................... 361/796 |

*Primary Examiner*—Lynn D. Feild
*Attorney, Agent, or Firm*—Pro-Techtor International Services

[57] ABSTRACT

An interface card positioning device including a positioning plate screwably fixed on a computer housing. The positioning plate cooperates with an adjusting screw and a sleeve fitted on the adjusting screw to hold the interface card firmly in position. Thus, cards such as VGA cards, network cards, IDE cards, sound cards, and IO cards may be firmly positioned after installation, and possible loosening or poor electrical contact due to transportation or prolonged use may be avoided.

2 Claims, 3 Drawing Sheets

12
INTERFACE CARD POSITIONING DEVICE

BACKGROUND OF THE INVENTION

1. Field of the Invention

The present invention relates generally to a device for positioning interface cards, and more particularly to a device which may firmly hold interface cards in the housing in a simple manner.

2. Description of the Prior Art

In consideration of future easy maintenance, expansion and replacement, the internal components of computers are designed to allow quick replacement or feasible expansion. The most effective and widely used way is to provide a slot on the computer housing, and design the components or circuit boards into cards, such as expansion cards, interface cards, etc., which may be selectively mounted on the computer. Quick installation, maintenance, change or expansion may thus be achieved.

With fast breakthroughs in computer technology and constant upgrading of computers, it is possible that the card components have to be replaced or added any time. As shown in FIG. 1, a card 2 along with its card member 3 is positioned in a card mounting slot 4 near a rear end of a computer housing, so that it may be connected to the computer itself or its exterior for expansion or replacement purposes. The suspended interface card (carrying circuit boards, electronic elements, sockets, and insert members, etc.) is secured by a screw 5. But the screw 5 may become loosened due to transportation, removal, or prolonged use, resulting in poor contact.

SUMMARY OF THE INVENTION

Accordingly, a primary object of the present invention is to provide a device for positioning interface or expansion cards, in which a positioning plate is screwably fixed at a computer housing to cooperate with an adjusting screw with a sleeve fitted thereon for firmly holding cards in the housing and preventing possible screw loosening or poor electrical contact.

BRIEF DESCRIPTION OF THE DRAWINGS

The foregoing and other features and advantages of the present invention will be more clearly understood from the following detailed description and the accompanying drawings, in which.

DETAILED DESCRIPTION OF THE PREFERRED EMBODIMENT

Figure 1:
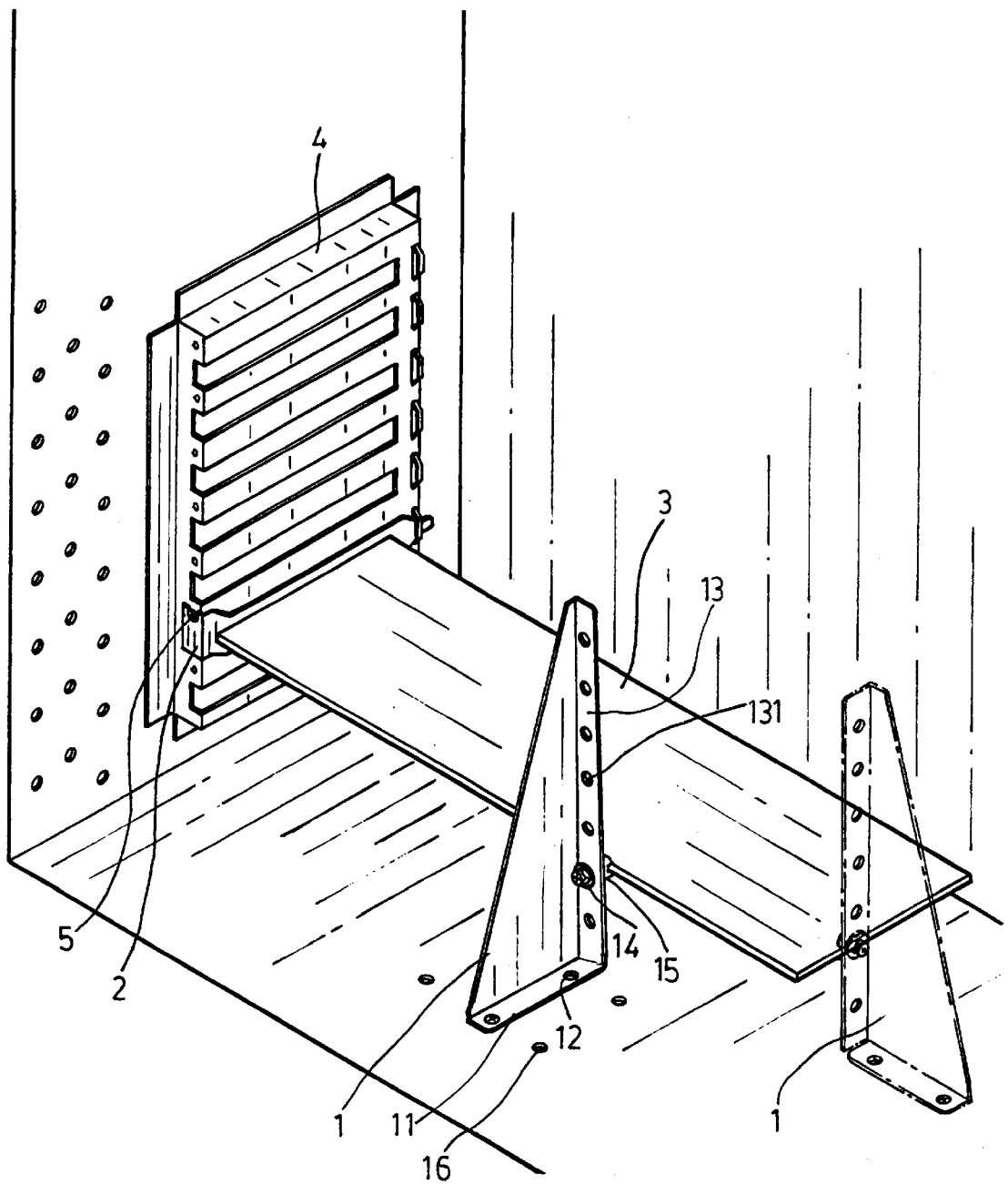
FIG. 1 is a perspective view of the system of the present invention.
Figure 2:
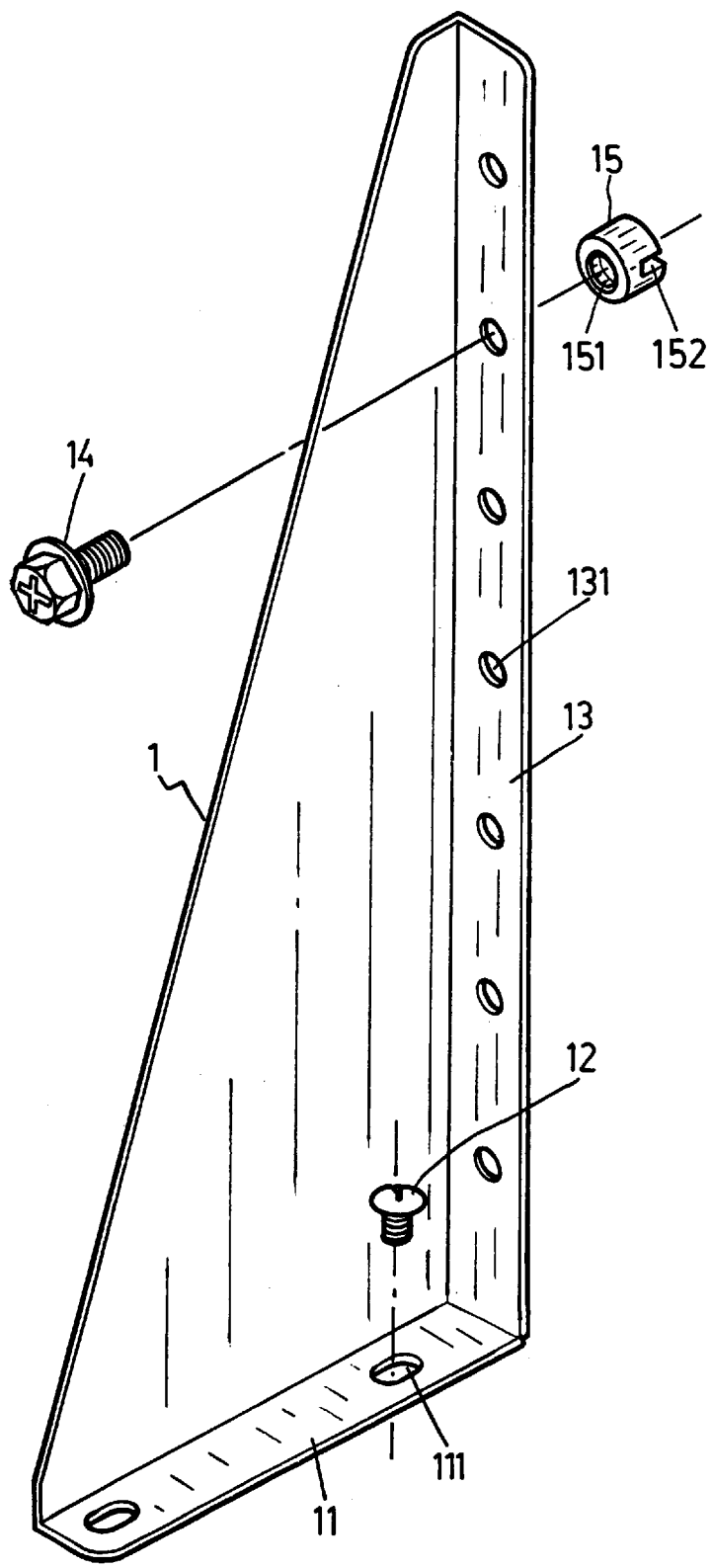
FIG. 2 is a detail view of the positioning plate.

As shown in FIGS. 1 and 2, a positioning plate 1 in the shape of a right-angle triangle has a first bent side 11 with holes 111, and a second bent side 13 with screw holes 131. Threaded holes 16 are formed in the computer housing at positions corresponding to the ends or sides of cards 3. Screws 12 are used to pass into the threaded holes 16 in the computer housing corresponding to the side or end of the card 3, with every screw hole 131 at the second side 13 of the positioning plate 1 aligning with the side or end of the card 3. An adjusting screw 14 may lock into one of the screw holes 131, and a sleeve 5 is fitted at one end of the adjusting screw 14. An end slot 151 of the sleeve allows insertion of the adjusting screw 14, while an open slot 152 at the opposite end may hold the card 3. The adjusting screw 14 enables positive and secure positioning of the expansion or interface card.

Figure 3:
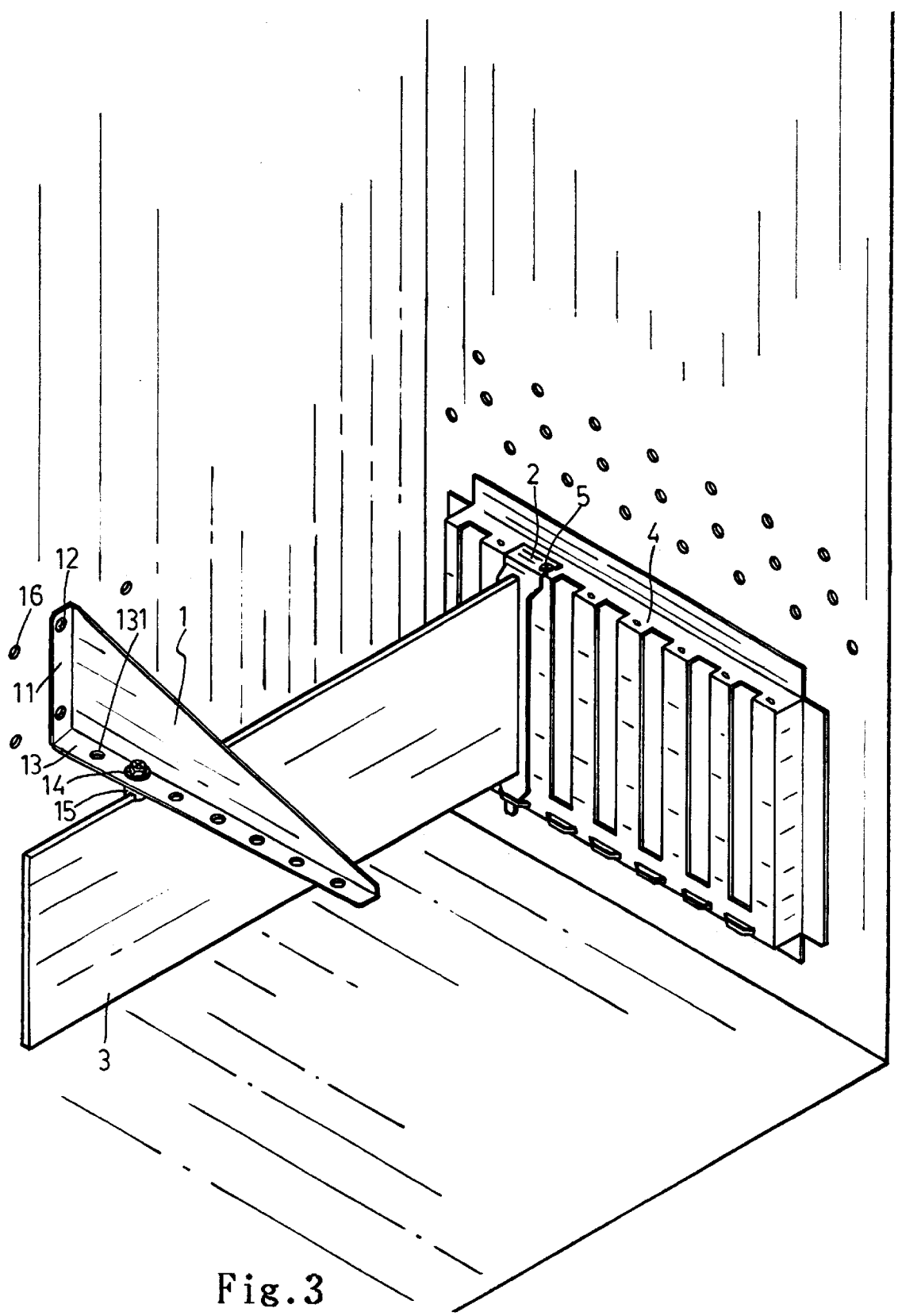
FIG. 3 is a view of the system utilized with vertical card slots.

As shown in FIG. 1, the positioning plate 1 illustrated in solid lines is positioned at the side of the card 3, but it may also be positioned at the end of the card 3, as shown by the positioning plate 1 in dotted lines. The present invention is applicable whether the card slots are horizontally or vertically arranged. In FIG. 1, the present invention is used in horizontal slots, and in FIG. 3, the present invention is used in vertical slots.

Although the present invention has been illustrated and described with reference to the preferred embodiment thereof, it should be understood that it is in no way limited to the details of such embodiment but is capable of numerous modifications within the scope of the appended claims.

What is claimed is:

1. An interface card positioning device, comprising threaded holes formed in a computer housing at positions corresponding to an end or side of a card; a positioning plate in the shape of a right-angled triangle having a first bent side with holes and a second bent side with screw holes, screws being passed through said holes of said first bent side into said threaded holes to lock said positioning plate at the end or side of said card, such that every screw hole in said second bent side aligns with the end or side of the card; and an adjusting screw being inserted into one of said screw holes, of said second bent side said adjusting screw being fitted with a sleeve, said sleeve having an open slot at a rear side for holding said card to positively secure said card.

2. An interface card positioning device as claimed in claim 1, wherein said positioning plate may be adapted for use in vertically or horizontally arranged slots.

* * * * *